United States Patent [19]

Yoshida et al.

[11] Patent Number: 4,771,434
[45] Date of Patent: Sep. 13, 1988

[54] SEMICONDUCTOR LASER DEVICE WITH AN INTEGRATED LIGHT-DETECTING AREA

[75] Inventors: Toshihiko Yoshida, Tenri; Haruhisa Takiguchi; Shinji Kaneiwa, both of Nara; Sadayoshi Matsui, Tenri, all of Japan

[73] Assignee: Sharp Kabushiki Kaisha, Osaka, Japan

[21] Appl. No.: 880,167

[22] Filed: Jun. 30, 1987

[30] Foreign Application Priority Data

Jul. 12, 1985 [JP] Japan ................... 60-154717

[51] Int. Cl.$^4$ ............................................. H01S 3/19
[52] U.S. Cl. ............................................ 372/50; 357/19
[58] Field of Search ...................... 372/50, 44; 357/19

[56] References Cited

U.S. PATENT DOCUMENTS

| | | | |
|---|---|---|---|
| 3,948,583 | 4/1976 | Tien | 350/96 WG |
| 4,297,653 | 10/1981 | Scifres et al. | 357/19 |
| 4,470,143 | 9/1984 | Kitamura et al. | 372/50 |
| 4,692,207 | 9/1987 | Bouadma et al. | 372/50 |

OTHER PUBLICATIONS

IBM Technical Disclosure Bulletin, vol. 27, No. 7B, Dec. 1984, pp. 4344, 4345, New York, U.S.; P. M. Mooney: "*Photodiode Array for Monitoring Individual Lasers in a Laser Array*".

Electronics Letters, vol. 18, No. 5, Mar. 1982, pp. 189, 190, London, GB; O. Wada et al.: "AlGaAs/GaAs Microcleaved Facet (MCF) Laser Monolithically Integrated with Photodiode".

Patents Abstracts of Japan, vol. 8, No. 256 (E-280) (1693), 22nd Nov. 1984; & JP-A-59 127 864 (Nippon Denki K.K.) 23-07-1984.

IEE Proceedings Section A a I, vol. 131, No. 5, part H, Oct. 1984, pp. 299-303, Old Woking, Surrey, GB; H. Matsueda et al.: "An Optoelectronic Integrated Device ...".

Applied Physics Letters, vol. 46, No. 3, Feb. 1985, pp. 226-228, American Institute of Physics, Woodbury, NY; T. Sanada et al.: "Monolithic Integration of a Low Threshold Current Quantum Well Laser and a Driver Circuit on a ..."

Primary Examiner—James W. Davie
Attorney, Agent, or Firm—Ciotti & Murashige, Irell & Manella

[57] ABSTRACT

A semiconductor laser apparatus comprising a laser-oscillating area and a light-detecting area, both of which are formed on a single substrate, wherein said laser-oscillating area and said light-detecting area have a common semiconductor layer with a first polarity disposed on said substrate and a common active layer disposed on said semiconductor layer, and said layer-oscillating area of said laser-oscillating area and/or said light-detecting area has a cladding layer with a second polarity disposed on said active layer, said laser-oscillating area and said light-detecting area being separated by a groove formed from the upper face of said cladding layer to the region below said active layer, and the active layer of said laser-oscillation area being flat while the active layer of said light-detecting area is sloped.

2 Claims, 1 Drawing Sheet

SEMICONDUCTOR LASER DEVICE WITH AN INTEGRATED LIGHT-DETECTING AREA

BACKGROUND OF THE INVENTION

1. Field of the Invention:

This invention relates to a semiconductor laser apparatus in which a laser-oscillating area and a light-detecting area are incorporated into one body.

2. Description of the prior art:

FIG. 2 shows a conventional semiconductor laser apparatus 1, which is produced as follows: On an n-InP substrate 2, an n-InP buffer layer 3, an InGaAsP active layer 4, and a p-InP cladding layer 5 are successively formed by liquid phase epitaxy. A common electrode 6 is formed on the back face of the substrate and a striped electrode 7 is formed on the upper face of the cladding layer 5. Then, a groove 9 is formed at right angles to the striped electrode 7 on the striped electrode 7 by a reactive ion-beam etching technique in a manner to reach the buffer layer 3, resulting in a laser-oscillating area 10 and a light-detecting area 11 on the single substrate 2. The laser oscillating area 5 is composed of the buffer layer 3, the lightemitting layer 4a, the cladding layer 5, and the electrode 7a. The light-detecting area 11 is composed of the buffer layer 3, the light-detecting layer 4b, the cladding layer 5, and the electrode 7b. Laser light produced in the laser-oscillating area 10 is emitted from both facets 10a and 10b of the laser-oscillating area 10. A part of the laser light from the facet 10b is absorbed and detected as electrical signals by the light-detecting layer 4b of the light-detecting area 11. The amount of optical output from the laseroscillating area 10 is monitored by the light-detecting area 11 so as to adjust the amount of current to be injected into the laser-oscillating area 10 to an appropriate level, so that the optical output from the laser-oscillating area 10 can be prevented from varying due to atmospheric temperature, reflected light, etc., and therefore it can be maintained at a fixed level. Such a stabilization of the optical output is significantly important for practical use of semiconductor lasers. However, the production of the light-detecting area 11 is extremely difficult although that the light-detecting area 11 is combined with the laser-oscillating area 10 is effective in improving light-detection characteristics of the light-detecting area 11.

In order to simplify the production process of the light-detecting area 11, the light-detecting area 11 can be integrated with the laser-oscillating area 10 on the single substrate 2 as shown in FIG. 2. However, since the light-emitting layer 4a of the laser-oscillating area 10 and the light-detecting layer 4b of the light-detecting area 11 are epitaxially grown at the same time, the resulting thickness of the light-detecting layer 4b is approximately 0.2 μm which is too thin to attain optimal light-detection characteristics. Moreover, the impurity concentration of the light-detecting layer 4b, which attains the highest detection sensitivity of the light-detecting area 11, is different from that of the light-emitting layer 4a of the laser-oscillating area 10 which attains the optimum laser characteristics. Therefore, the detection sensitivity of the light-detecting area 11 must be enhanced at the sacrifice of the operation ability of the laser-oscillating area 10. On the other hand, laser light is radiated, with spread in the direction of the thickness of the light-emitting layer 4a, from the facet 10b of the laser-oscillating area 10 to the light-detecting area 11, so that only a slight amount of laser light is absorbed by the light-detecting layer 4b of the light-detecting area 11, which causes difficulties in enhancing the detection sensitivity of the light-detecting area 11. Moreover, although such an integration of the light-detecting area 11 with the laser-oscillating area 10 allows the miniaturization of the semiconductor laser apparatus 1, an improvement of the reliability thereof cannot be attained.

In summary, a semiconductor laser apparatus, in which a light-detecting area 11 for minitoring the optical output from a laser-oscillating area 10 so as to maintain the output at a certain level is integrated with the laser-oscillating area 10 on a single substrate 2 into one body, is disadvantageous in that the detection efficiency of the light-detecting area 11 cannot be enhanced.

SUMMARY OF THE INVENTION

The semiconductor laser apparatus of this invention, which overcomes the above-discussed and numerous other disadvantages and deficiencies of the prior art, comprises a laser-oscillating area and a light-detecting area, both of which are formed on a single substrate, wherein said laser-oscillating area and said light-detecting area have a common semiconductor layer with a first polarity disposed on said substrate and a common active layer disposed on said semiconductor layer, and said laser-oscillating area of said laser-oscillating area and/or said light-detecting area has a cladding layer with a second polarity disposed on said active layer, said laser-oscillating area and said light-detecting area being separated by a groove formed from the upper face of said cladding layer to the region below said active layer, and the active layer of said laser-oscillation area being flat while the active layer of said light-detecting area is sloped.

In a preferred embodiment, the substrate is a terraced substrate.

In a preferred embodiment, the laser-oscillating area is located in the first flat portion of said substrate and said light-detecting area is located in the terraced portion of said substrate composed of the sloped portion and the second flat portion.

Thus, the invention described herein makes possible the object of providing a miniature semiconductor laser apparatus which attains a high laser light detection efficiency and a high reliability.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a miniature semiconductor laser apparatus in which a laseroscillating area is formed on the flat portion of a terraced substrate and a light-detecting area is formed on the terraced portion of the terraced substrate, thereby allowing the enhancement of the laser-light detection efficiency of the light-detecting area and attaining a high reliability of this apparatus.

Example

Figure 1:
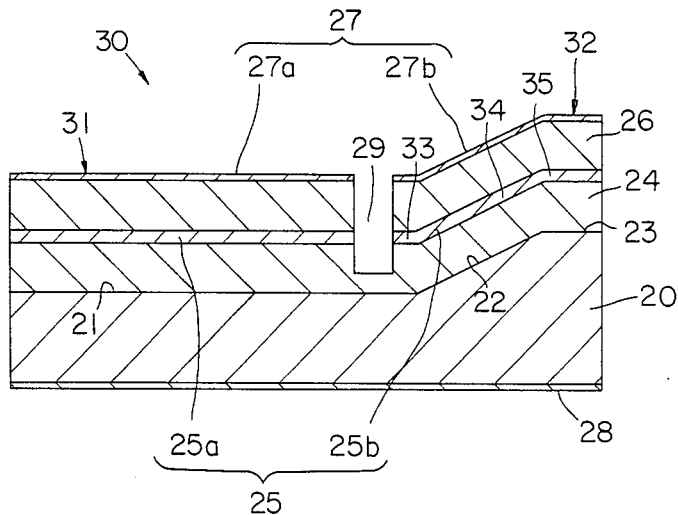
FIG. 1 is a side sectional view showing a semiconductor layer apparatus of this invention.
Figure 2:
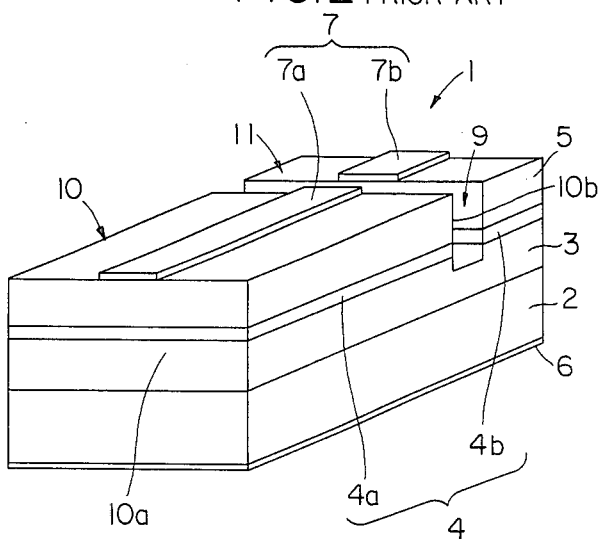
FIG. 2 is a perspective view showing a conventional semiconductor laser apparatus.

FIG. 1 shows a semiconductor laser apparatus 30 of this invention which comprises a terraced substrate 20, a laser-oscillating area 31 disposed on the flat portion 21 of the substrate 20, and a light-detecting area 32 disposed on the terraced portion (composed of the sloped portion 22 and the flat portion 23) of the substrate 20.

The laser-oscillating area 31 comprises a flat buffer layer 24, a flat light-emitting layer 25, a flat cladding layer 26, and a flat electrode 27a. The light-detecting area 32 comprises a terraced buffer layer 24, a terraced light-detecting layer 25b, a terraced cladding layer 26, and a terraced electrode 27b.

This semiconductor laser apparatus is produced as follows: The (100) face of an n-InP substrate, one end portion of which is masked by a masking means, is subjected to an etching treatment with an etchant containing HCl in the <011> direction, resulting in a terraced n-InP substrate 20 which is composed of the first flat portion 21, the second flat portion 23 which is higher than the first flat portion 21 by approximately 2 $\mu$m, and the sloped portion 22 connecting the first flat portion 21 with the second flat portion 23. The angle of inclination of the sloped portion 22 is approximately 28 degrees when the substrate is etched with an HCl-H$_2$O etchant (HCl:H$_2$O=4:1). After the masking means is removed from the terraced substrate 20, an n-buffer layer ($n \leqq 5 \times 10^{17}$ cm$^{-3}$) 24 having a thickness of 7 $\mu$m is formed on the whole surface of the terraced substrate 20 by the metal organic-chemical vapor deposition (MOCVD) method. Then, on the buffer layer 24, a non-doped In$_{1-x}$Ga$_x$As$_{1-y}$P$_y$ ($0 \leqq X \leqq 0.5$, $0 \leqq y \leqq 1$) active layer 25 and a p-cladding layer ($p \leqq 5 \times 10^{17}$ cm$^{-3}$) 26 are successively formed by the same MOCVD method as mentioned above. Then, a striped electrode 27 is formed on the upper face of the cladding layer 26 in the <011> direction and a common electrode 28 is formed on the back face of the substrate 20. Then, a groove 29 is formed at right angles to the striped electrode 27 from the upper face of the cladding layer 26 including the striped electrode 27 to the buffer layer 24 by a reactive ion-beam etching technique, resulting in a semiconductor laser apparatus 30 having the laser-oscillating area 31 and the light-detecting area 32 on the terraced substrate 20.

Laser light is radiated with a spread angle ranging from about 23 to 28 degrees from the facet on the groove side of the laser-oscillating area 31 to the face on the grooved side of the light-detecting layer 25b of the light-detecting area 32. The light-detecting layer 25b is formed to be parallel to the terraced portion (composed of the sloped portion 22 and the second flat portion 23) of the substrate 20. That is, the light-detecting layer 25b is composed of a first flat portion 33, one end of which constitutes the face 25c, a sloped portion 34, with an inclination angle of 28 degrees, which is parallel to the sloped portion 22 of the substrate 20, and a second flat portion 35 connecting to the sloped portion 34. Since the light-detecting layer 25b is formed into a curved shape as mentioned above, a larger amount of light from the laser-oscillating area 31 can be absorbed by the light-detecting layer 25b of the light-detecting area 32, compared with a conventional semiconductor laser apparatus having a flat light-detecting layer. Thus, the semiconductor laser apparatus of this invention can attain the enhancement of the detection sensitivity of the light-detecting area.

It was found by the inventor's experiments that when the inclination angle of the sloped portion 34 of the light-detecting layer 25b was set at approximately 28 degrees, output power of the light-detecting area 32 was enhanced several times that of a conventional light-detecting area without sacrificing the characteristics of the laser-oscillating area 31. On the other hand, since the spread angle of laser light emitted from the facets of the laser-oscillating area 31 has a half width at the half maximum in the range of approximately 23 to 28 degrees, in order for as much of the laser light as possible to irradiate on the light-detecting layer 25b of the light-detecting area 32. The width of the groove 29 was set at a value of 7 $\mu$m in this example.

The formation of the sloped portion 34 of the light-detecting layer 25b in the light-detecting area 32 provides the following advantages:

(1) Output power of the light-detecting area 32 is enhanced, so that optical noise can be suppressed and the stabilization of laser light output power can be improved.

(2) Since the laser-oscillating area 31 and the light-detecting area 32 are formed by the same semiconductor multi-layered crystal, an integration of them on a single substrate 20 can be achieved, which allows the miniaturization and the improvement of the reliability of this apparatus.

(3) A substrate is readily formed into a terraced shape by an etching technique using an etchant containing HCl, so that the production process of this apparatus can be simplified.

(4) This apparatus is useful in such fields as optical communication, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser apparatus comprising a laser-oscillating area and a light-detecting area, both of which are formed on a single substrate, wherein said laser-oscillating area and said light-detecting area have a common semiconductor layer with a first conductivity type disposed on said substrate and a common active layer disposed on said semiconductor layer, and said laser-oscillating area has a cladding layer with a second conductivity type disposed on said active layer, said laser-oscillating area and said light-detecting area being separated by a groove formed from the upper face of said cladding layer to the region below said active layer, and the active layer of said laser-oscillating area being flat while the active layer of said light-detecting area is sloped at least in a region of said light-detecting area.

2. A semiconductor laser apparatus according to claim 1, wherein said substrate is a terraced substrate, said laser-oscillating area being located in a first flat portion of said substrate and said light-detecting area being located in a terraced portion of said substrate having a sloped portion and a second flat portion.

* * * * *